United States Patent
Hong et al.

(10) Patent No.: US 6,391,704 B1
(45) Date of Patent: May 21, 2002

(54) METHOD FOR MANUFACTURING AN MDL SEMICONDUCTOR DEVICE INCLUDING A DRAM DEVICE HAVING SELF-ALIGNED CONTACT HOLE AND A LOGIC DEVICE HAVING DUAL GATE STRUCTURE

(75) Inventors: Suk-gu Hong, Yongin; Hyung-Moo Park, Seoul, both of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/933,356

(22) Filed: Aug. 20, 2001

(30) Foreign Application Priority Data

Nov. 14, 2000 (KR) .......................................... 2000-67469

(51) Int. Cl.[7] .......................................... H01L 21/8242
(52) U.S. Cl. ...................... 438/241; 438/210; 438/532; 438/592
(58) Field of Search ................................ 438/210, 241, 438/253, 396, 532, 592, 655, 656

(56) References Cited

U.S. PATENT DOCUMENTS 5,998,252 A * 12/1999 Huang ........................ 438/241
6,146,994 A * 11/2000 Hwang ........................ 438/592
6,174,807 B1 * 1/2001 Kizilyalli et al. ............ 438/592
6,235,574 B1 * 5/2001 Tobben et al. .............. 438/241

* cited by examiner

Primary Examiner—Chandra Chaudhari
(74) Attorney, Agent, or Firm—Mills & Onello LLP (57) ABSTRACT

A method for manufacturing an MDL semiconductor device comprises forming a gate insulating layer and a gate conductive layer in a DRAM device region and a logic device region to provide gate conductive layer patterns which will be respectively formed in the DRAM device region and the logic device region. Next, the gate conductive layer of the logic device region is patterned, and a gate conductive layer pattern is formed only in the logic device region. Spacers are formed on the gate conductive layer patterns, and impurity ions of different conductivity types are twice injected by a process for forming a mask layer pattern and an ion injection process. The first ion injection is performed on one gate conductive layer pattern of the logic device region, and the second ion injection is performed on the gate conductive layer of the DRAM device region and the other gate conductive layer pattern of the logic device region. Next, a patterning process is performed on the DRAM device region for forming gate conductive layer stacks, and self-aligned contact pads are formed.

12 Claims, 9 Drawing Sheets

METHOD FOR MANUFACTURING AN MDL SEMICONDUCTOR DEVICE INCLUDING A DRAM DEVICE HAVING SELF-ALIGNED CONTACT HOLE AND A LOGIC DEVICE HAVING DUAL GATE STRUCTURE

BACKGROUND OF THE INVENTION

1. Field of the Invention

The present invention relates to a method for manufacturing a semiconductor device, and more particularly, to a method for manufacturing an MDL semiconductor device including a DRAM device having a self-aligned contact hole and a logic device having a dual gate structure.

2. Description of the Related Art

System on a chip design has evolved with the need for high integration, ultra minuteness of various material layer patterns, high performance, and large wafer diameter in the manufacture of semiconductor devices, as well as the demand for various consumer products utilizing such semiconductor devices. With this trend, due to fast development in the semiconductor field, a high performance and high added-value semiconductor device, including a memory logic merged semiconductor device which is a memory semiconductor device and a logic semiconductor device within one chip, is produced. Particularly, a memory logic merged semiconductor device having a dynamic random access memory (DRAM) referred to as a "merged DRAM logic (MDL)" semiconductor device has become popular.

Important issues addressed by the MDL semiconductor device include improvement of DRAM device integration and logic device performance. Recently, a self-aligned contact hole (SAC) technique has been employed for improving DRAM device integration, while a dual-gate structure has been used for improving logic device performance. Here, a dual gate structure means a structure in which respective gates of a complementary MOS transistor are doped with different conductive type impurity ions.

However, when a self-aligned contact hole is used in a DRAM device, it is not easy to dope impurities of different conductive types on the gates of the complementary MOS transistors in the logic circuit. It is preferable to dope impurities of different conductive types on the respective gates to create a high-performance, complementary MOS transistor in a logic circuit. When the respective gates are formed on a DRAM device and a logic device, and a self-aligned contact hole is formed on the DRAM device, a silicon nitride layer is formed for a self-aligned contact process. The silicon nitride layer is formed not only in a DRAM device region but also in the logic device region, such that the process for doping impurities on the gates of the logic device is restricted. To solve this problem, gate patterns are formed on the logic device separately from the DRAM device, and a process for injecting impurity ions is performed twice using respective mask layer patterns. However, in this case, the process is complicated, and production cost is increased due to an increased use of the mask layer patterns.

SUMMARY OF THE INVENTION

To address the above limitations, it is an objective of the present invention to provide a method for manufacturing an MDL semiconductor device including a DRAM device having a self-aligned contact hole and a logic device having a dual gate structure using fewer mask layers.

Accordingly, to achieve the above objective, there is provided a method for forming an MDL semiconductor device including a DRAM device and a logic device on a semiconductor substrate having a DRAM device region and a logic device region according to the present invention, comprising the steps of forming a gate dielectric layer and a gate conductive layer on a semiconductor substrate; forming first and second gate conductive layer patterns in first and second MOS regions, respectively, in a logic device region of the semiconductor substrate; forming first and second gate spacers on the sidewalls of the first and second gate conductive layer patterns; injecting impurity ions of a first conductive type onto the exposed first gate conductive layer pattern and the semiconductor substrate using a first mask layer pattern exposing the first MOS region; injecting impurity ions of a second conductive type onto the gate conductive layer of the exposed DRAM device region, the second gate conductive layer pattern of the logic device region, and the semiconductor substrate using a second mask layer pattern exposing the DRAM device region and the second MOS region; forming a nitride layer which covers the gate conductive layer of the DRAM device region, the first and second gate conductive layer of the logic device region, the first and second gate spacers, and the exposed semiconductor substrate; forming gate conductive layer stacks, in which the gate conductive layer patterns and the nitride layer patterns are sequentially deposited in the DRAM region using a third mask layer pattern which partially exposes the nitride layer of the DRAM device region; forming gate spacers on the sidewalls of the gate conductive layer stacks of the DRAM device region; and forming self-aligned contact pads inter-insulated between the gate spacers of the DRAM device region.

In the present invention, a step of forming an isolation layer, which isolates the DRAM device region from the logic device region and isolates the first MOS region from the second MOS region, may be further included.

It is preferable that the impurity ions of the first conductive type are P-type impurity ions, and that the impurity ions of the second conductive type are N-type impurity ions.

The method may further include forming a metal silicide layer/region on the surface of the semiconductor substrate to be used as an upper portion of the gate conductive layer of the DRAM device region and as an upper portion and a source/drain region of the first and second gate conductive layer patterns of the logic device region.

An oxide layer may be formed before the step of forming the nitride layer. Here, it is preferable that the oxide layer is a high-temperature oxide layer.

The step of forming the gate conductive layer stacks preferably includes a step of forming a fourth mask layer pattern which exposes parts of the nitride layer of the DRAM device region, and a step of etching the nitride layer and the gate conductive layer using the fourth mask layer pattern as an etching mask.

The step of forming the self-aligned contact pads preferably includes the steps of forming an interdielectric layer which covers the gate conductive layer stacks and gate spacers of the DRAM device region, and the nitride layer of the logic device region; forming a fifth mask layer pattern which expose parts of the surface of the interdielectric layer of the DRAM device region; forming a self-aligned contact hole by etching the exposed interdielectric layer using the fifth mask layer pattern as an etching mask, and exposing parts of the surface of the semiconductor substrate of the DRAM device region; removing the fifth mask layer pattern; and forming self-aligned contact pads by filling the self-aligned contact hole with a conductive layer. In this case, it is preferable that the interdielectric layer is formed of a material having an etching selectivity with respect to the nitride layer, for example, the interdielectric layer may be an oxide layer. It is also preferable that the conductive layer is a polysilicon layer.

BRIEF DESCRIPTION OF THE DRAWINGS

The above objective and advantages of the present invention will become more apparent by describing in detail a preferred embodiment thereof with reference to the attached drawings in which.

DETAILED DESCRIPTION OF PREFERRED EMBODIMENTS

The present invention now will be described more fully with reference to the accompanying drawings in which preferred embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art.

In the drawings, the thickness of layers and regions are exaggerated for clarity. It will also be understood that when a layer is referred to as being "on" another layer or substrate, it can be directly on the other layer or substrate, or intervening layers may also be present. The same reference numerals in different drawings represent the same element, and thus their description will be omitted.

FIGS. 1 through 9 are sectional views illustrating a method for forming an MDL semiconductor device according to the present invention.

Figure 1:
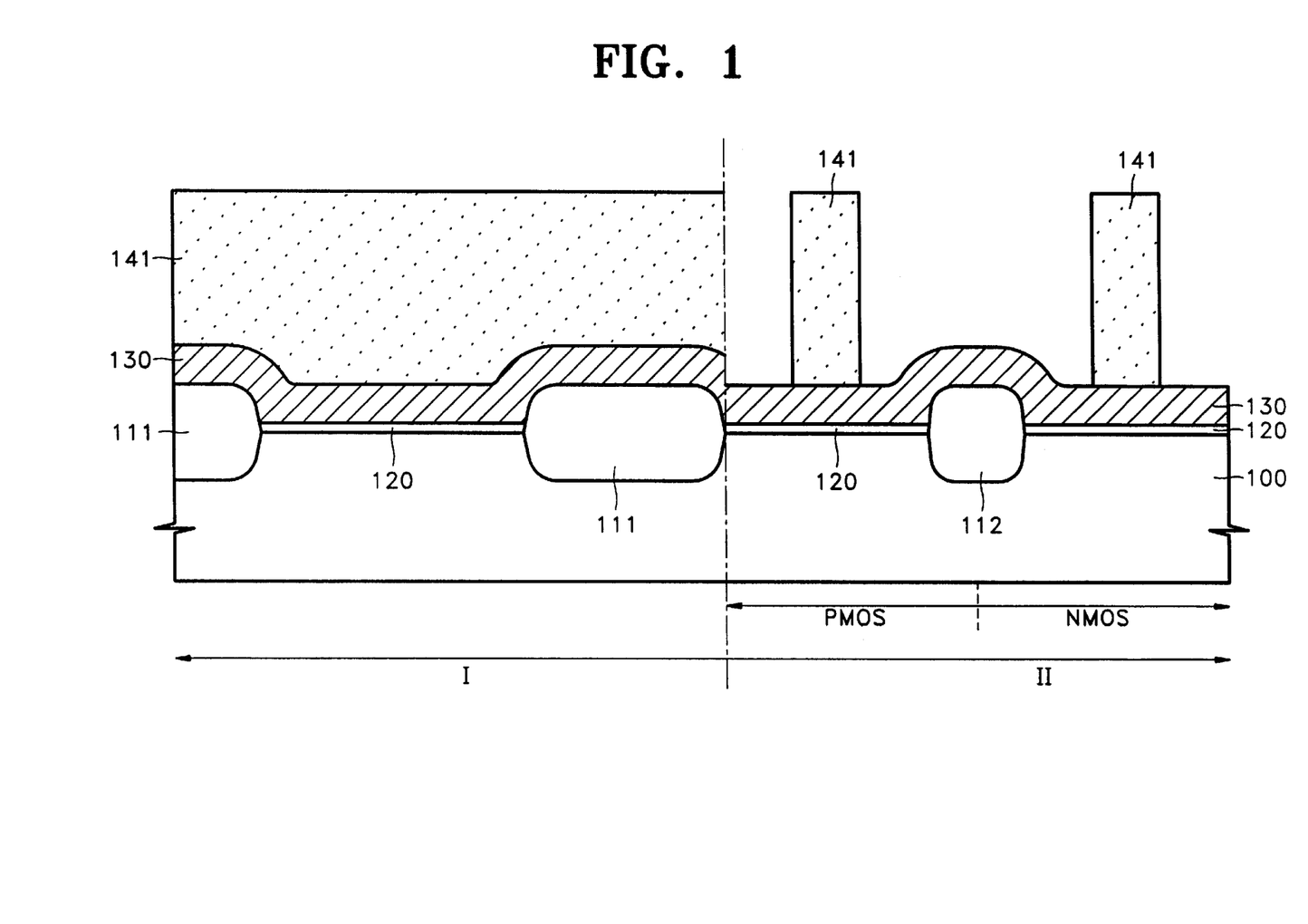
FIGS. 1 through 9 are sectional views illustrating a method for forming an MDL semiconductor device according to the present invention.

Referring to FIG. 1, a first isolation layer 111 and a second isolation layer 112 are formed on a semiconductor substrate 100, in which a first region (I) where a DRAM device is disposed and a second region (II) where a logic device is disposed are defined. The first isolation layer 111 isolates unit cells on the DRAM device, and the second isolation layer 112 isolates a P-type MOS transistor region (PMOS) and an N-type MOS transistor region (NMOS) on the logic device. The first and second isolation layers 111 and 112 are field oxide layers formed using a general local oxidation of silicon (LOCOS) method, but it is natural that they can be formed as a trench.

After the first and second isolation layers 111 and 112 are formed, an oxidation process is performed, and a gate oxide layer 120 is formed in the first and second regions (I, II). Next, a gate conductive layer 130 is formed on the gate oxide layer 120 of the first and second regions (I, II) and on the first and second isolation layers 111 and 112. The gate conductive layer 130 may be formed of polysilicon. Next, exposure and development are performed by a general photolithography process, and a photoresist layer pattern 141 is formed. The photoresist layer pattern 141 completely covers the gate conductive layer 130 in the first region (I), but covers parts of the gate conductive layer 130 in the second region (II).

Figure 2:
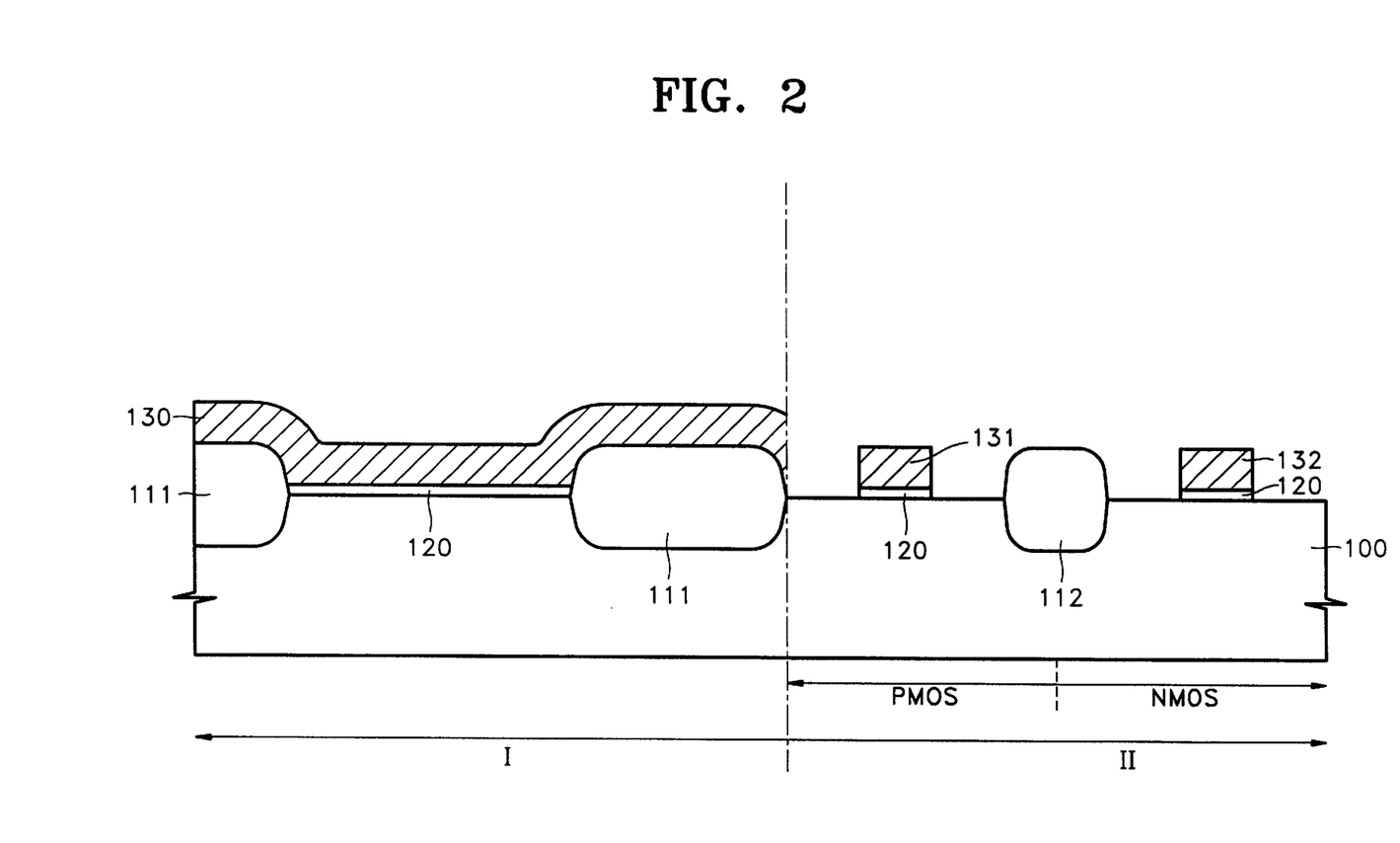

Next, referring to FIG. 2, an etching process is performed using the photoresist layer pattern 141 as an etching mask, and the exposed gate conductive layer 130 in the second region (II) is removed. Next, the gate dielectric layer 120 exposed by the removal of the gate conductive layer 130 is sequentially removed. After the etching process, the photoresist pattern 141 is removed, and a first gate conductive layer pattern 131 and a second gate conductive layer pattern 132 are formed in the PMOS transistor region and the NMOS transistor region, respectively, in the second region (II).

Figure 3:
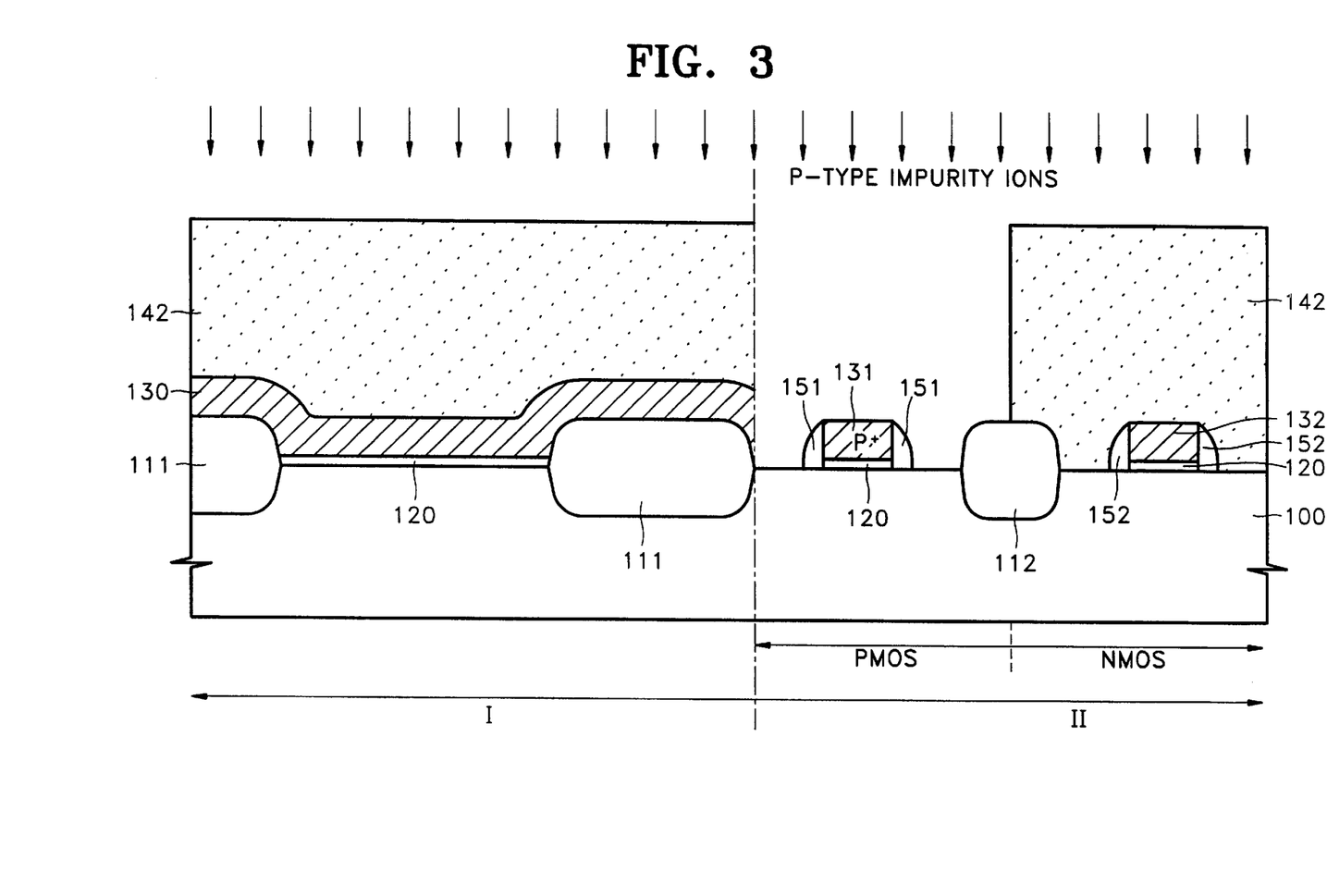

Next, referring to FIG. 3, a first gate spacer 151 and a second gate spacer 152 are formed on the sidewalls of the first gate conductive layer pattern 131 and the second gate conductive layer pattern 132 of the second region (II), respectively. That is, an oxide layer or a nitride layer is formed with a predetermined thickness on the whole surface of the resultant structure described in FIG. 2, and the first gate spacer 151 and the second gate spacer 152 are formed by etching the oxide layer or the nitride layer using a general etching method having anisotropic features, for example, a reaction ion etching method or an etch back method. Next, exposure and development are performed by a general photolithography process, and a photoresist layer pattern 142 is formed. The photoresist layer pattern 142 completely covers the gate conductive layer 130 in the first region (I) and the NMOS transistor region in the second region (II), but exposes the PMOS transistor region in the second region (II). Next, P-type impurity ions are injected using the photoresist layer pattern 142 as an ion implantation mask. The first gate conductive layer pattern 131 of the PMOS transistor region is doped with the P-type impurity ions. At the same time, the P-type impurity ions are injected to the PMOS transistor region of the semiconductor substrate 100 for forming a P-type source/drain region.

Figure 4:
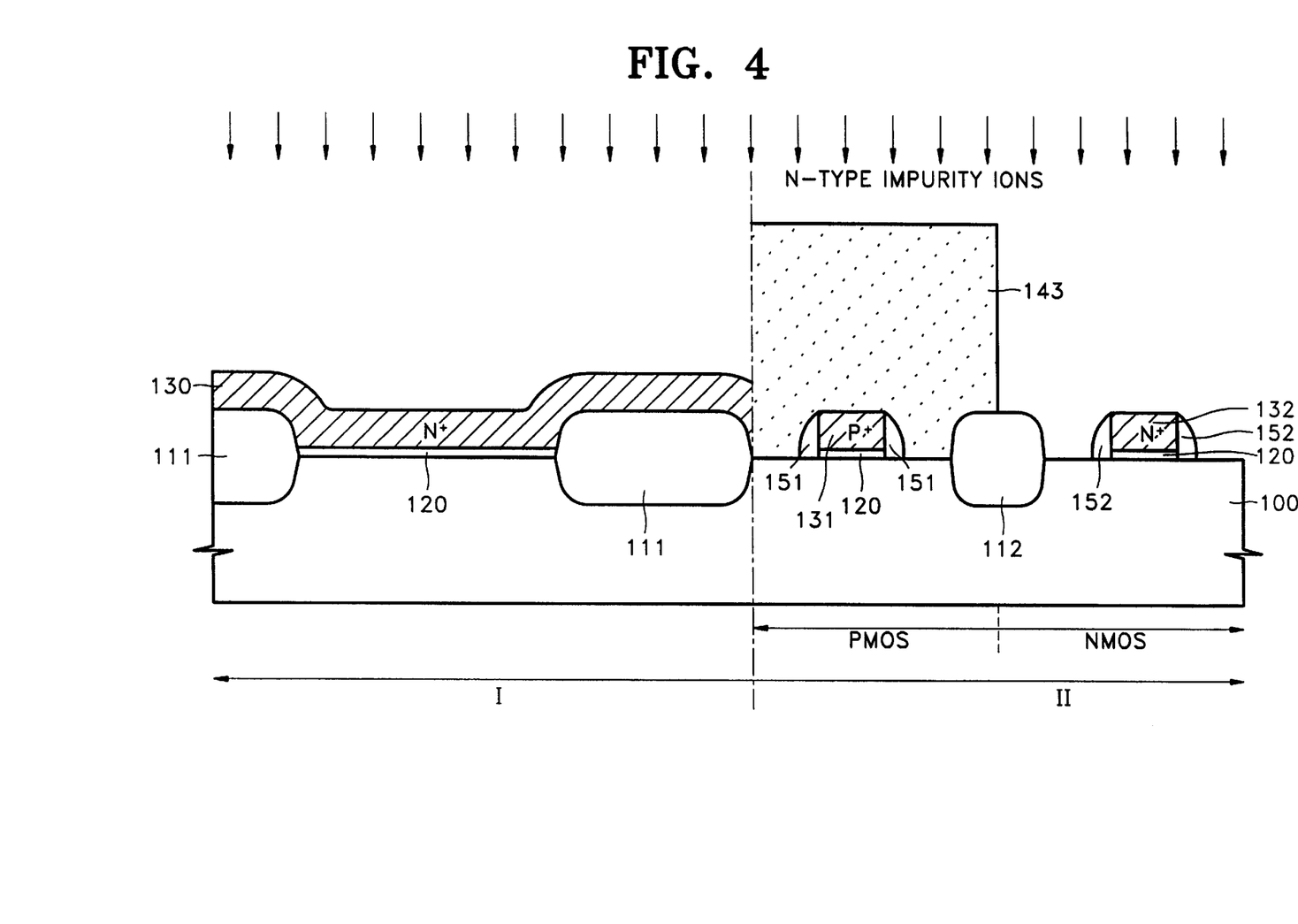

Next, referring to FIG. 4, the photoresist layer pattern 142 of FIG. 3 is removed, and exposure and development are performed again by the general photolithography process to form a photoresist layer pattern 143. The photoresist layer pattern 143 completely exposes the gate conductive layer 130 in the first region (I) and exposes only the NMOS transistor region in the second region (II), but completely covers the PMOS transistor region in the second region (II). Next, N-type impurity ions are injected using the photoresist layer pattern 143 as an ion implantation mask. The gate conductive layer 130 of the first region (I) and the second gate conductive layer pattern 132 of the NMOS transistor region in the second region (II) are doped with the N-type impurity ions. At the same time, the N-type impurity ions are injected to the NMOS transistor region of the semiconductor substrate 100 for forming an N-type source/drain region.

Figure 5:
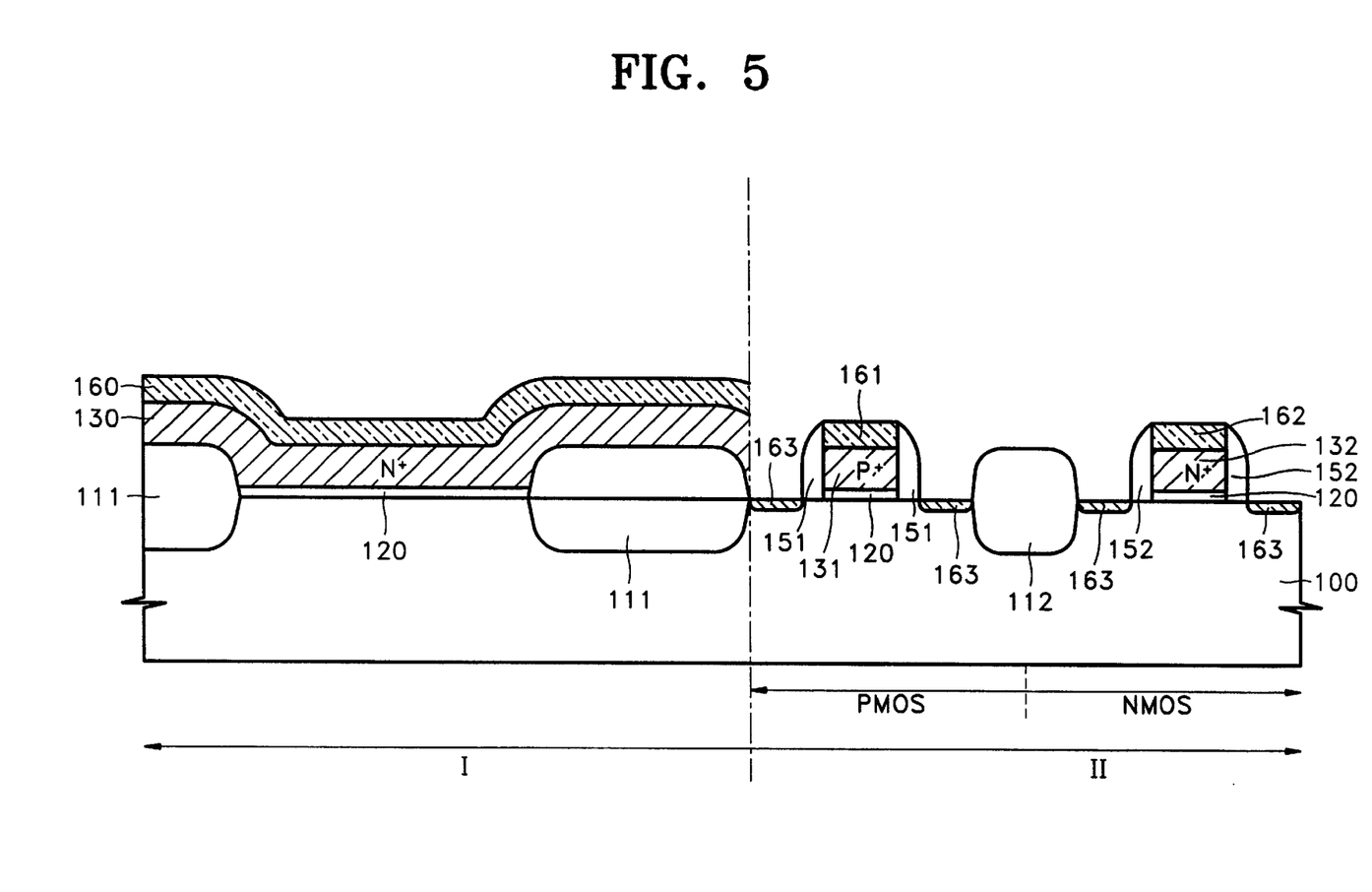

Next, referring to FIG. 5, the photoresist layer pattern 143 of FIG. 4 is removed, and a metal silicide layer 160 is formed on the gate conductive layer 130 of the first region (I). At the same time, a first metal silicide layer 161 and a second metal silicide layer 162 are formed on the upper portions of the first gate conductive layer pattern 131 and the second gate conductive layer pattern 132 of the second region (II), respectively. At the same time as forming the metal silicide layers 160, 161 and 162, metal silicide regions 163 are formed on the exposed surface of the semiconductor substrate 100 in the second region (II). The metal silicide regions 163 formed on the semiconductor substrate 100 enhance the performance of the device by reducing the resistance of the respective source/drain regions of the PMOS transistor and the NMOS transistor.

Figure 6:
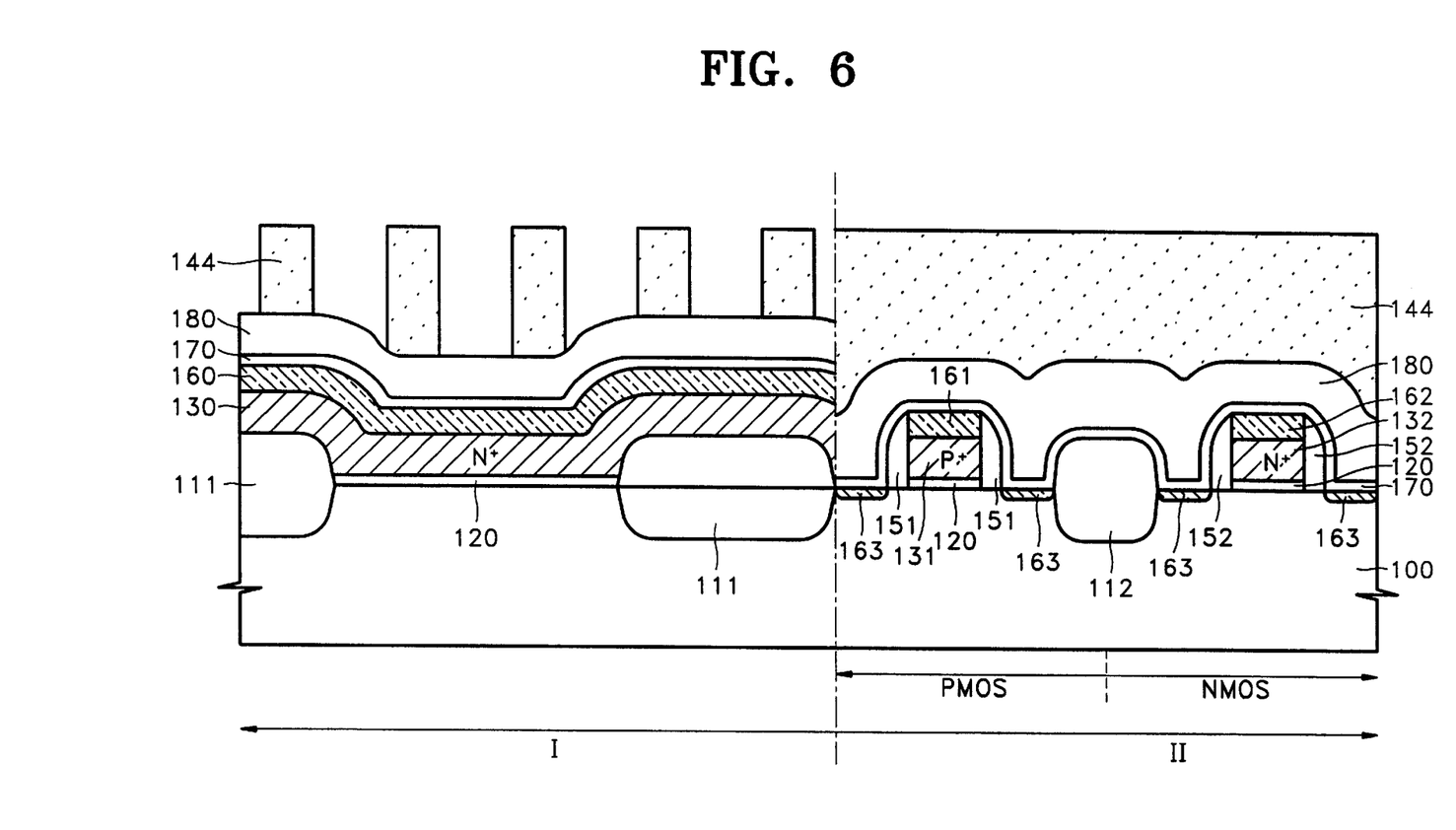

Next, referring to FIG. 6, an oxide layer 170 and a nitride layer 180 are sequentially formed on the whole surface of the resultant structure of FIG. 6. The oxide layer 170 and the nitride layer 180 can be formed as a single layer of an oxide layer containing nitride. A high temperature oxide (HTO)

layer may be used as the oxide layer 170. The oxide layer 170 is formed to completely cover the metal silicide layer 160 in the first region (I), and the metal silicide layers 163, the first and second gate spacers 151 and 152, and the first and second metal suicide layers 161 and 162 in the second region (II). Next, exposure and development are performed by the general photolithography process, and a photoresist layer pattern 144 is formed. The photoresist layer pattern 144 exposes parts of the surface of the nitride layer 180 in the first region (I), but completely covers the nitride layer 180 in the second region (II).

Figure 7:
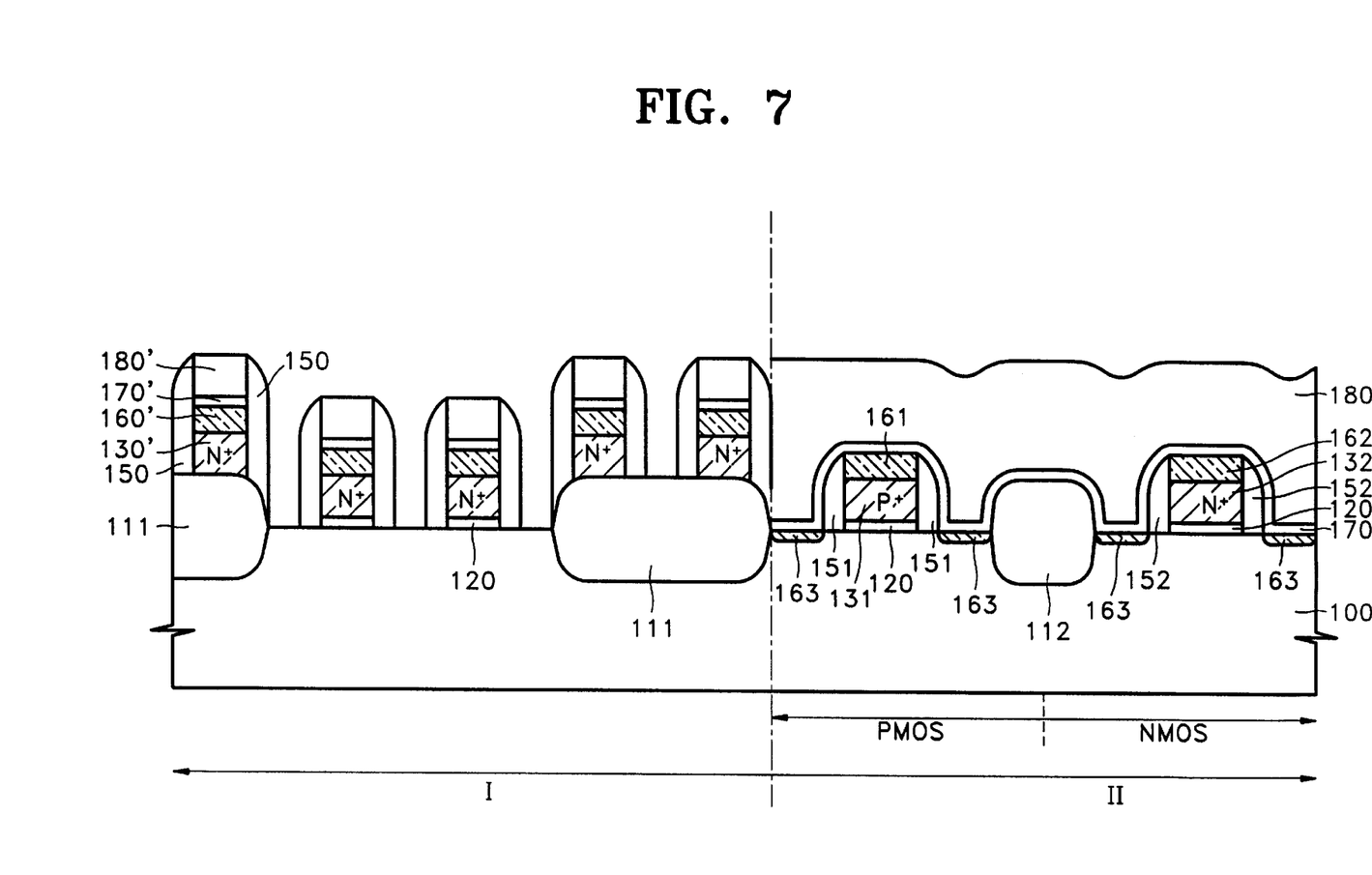

Next, referring to FIG. 7, an etching process is performed using the photoresist layer pattern 144 of FIG. 6 as an etching mask, and gate conductive layer stacks are formed in the first region (I). Here, the gate conductive layer stack is a structural body, in which a gate conductive layer pattern 130', a metal silicide layer pattern 160', an oxide layer pattern 170', and a nitride layer pattern 180' are sequentially deposited on the gate dielectric layer 120. That is, the nitride layer pattern 180' is formed by removing the nitride layer 180 of FIG. 6 exposed by the photoresist layer pattern 144. Next, the oxide layer pattern 170' is formed by removing the exposed oxide layer 170 of FIG. 6. Next, the metal suicide layer pattern 160' is formed by removing the exposed metal silicide layer 160 of FIG. 6. Next, the gate conductive layer pattern 130' is formed by removing the exposed gate conductive layer 130 of FIG. 6. Since the photoresist layer pattern 144 completely covers the second region (II), no changes happen in the second region (II) during the etching process. After the gate conductive layer stacks are formed in the first region (I) by the etching process, the photoresist layer pattern 144 is removed. Next, gate spacers 150 are formed on the sidewalls of the gate conductive layer stacks of the first region (I). That is, a nitride layer is formed with a predetermined thickness on the whole surface of the semiconductor substrate 100 having the gate conductive layer stacks, and then the nitride layer is etched using a general etching method having anisotropic features, for example, a reaction ion etching method or an etch back method, to form the gate spacers 150.

Figure 8:
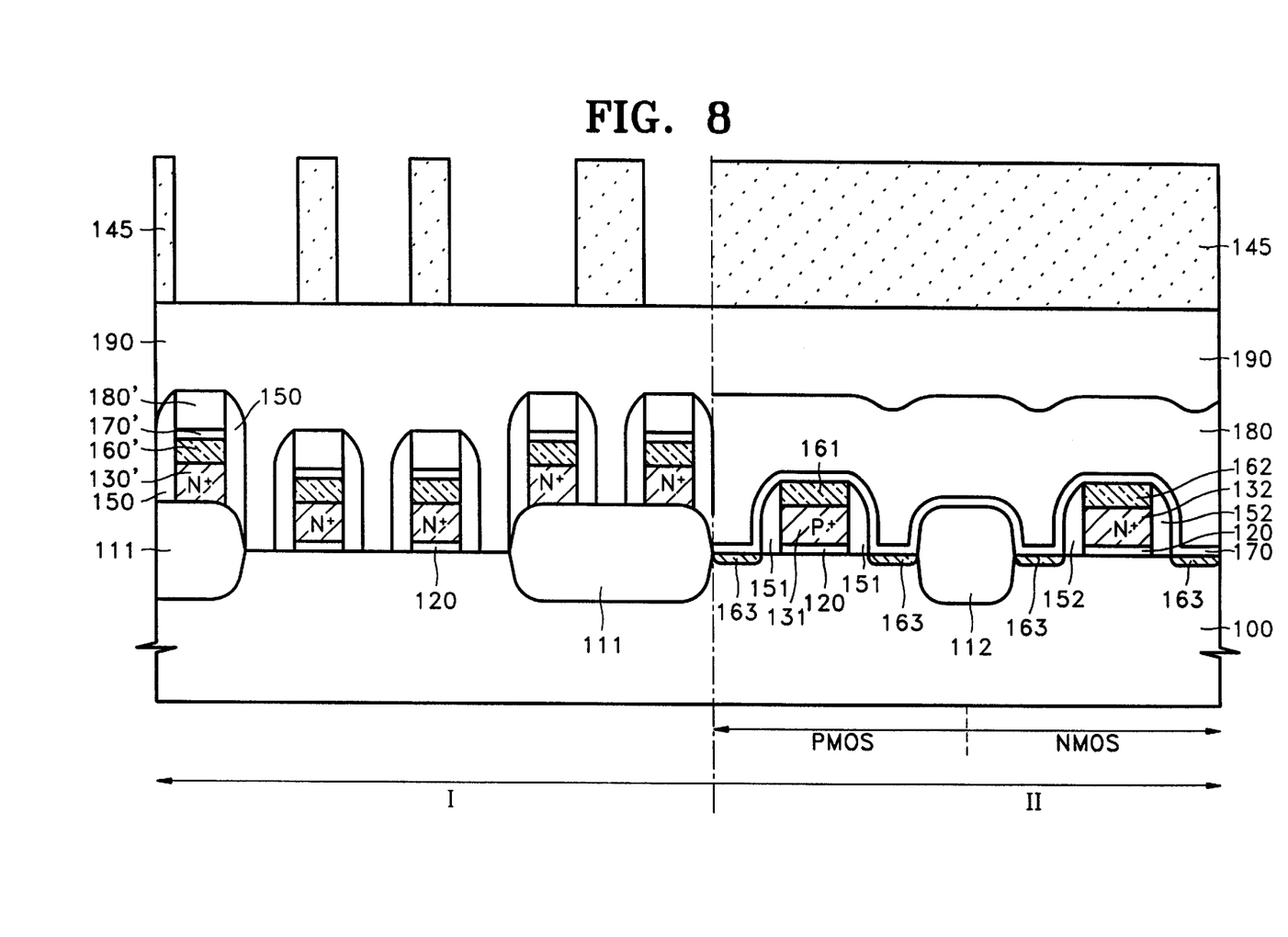

Next, referring to FIG. 8, an interdielectric layer 190, such as an oxide layer, is formed on the entire surface of the resultant structure of FIG. 7, and the interdielectric layer 190 is planarized using a chemical mechanical planarizing method. Next, exposure and development are performed by the general photolithography process, and a photoresist layer pattern 145 is formed. The photoresist layer pattern 145 exposes parts of the interdielectric layer 190 in the first region (I), but completely covers the interdielectric layer 190 in the second region (II).

Figure 9:
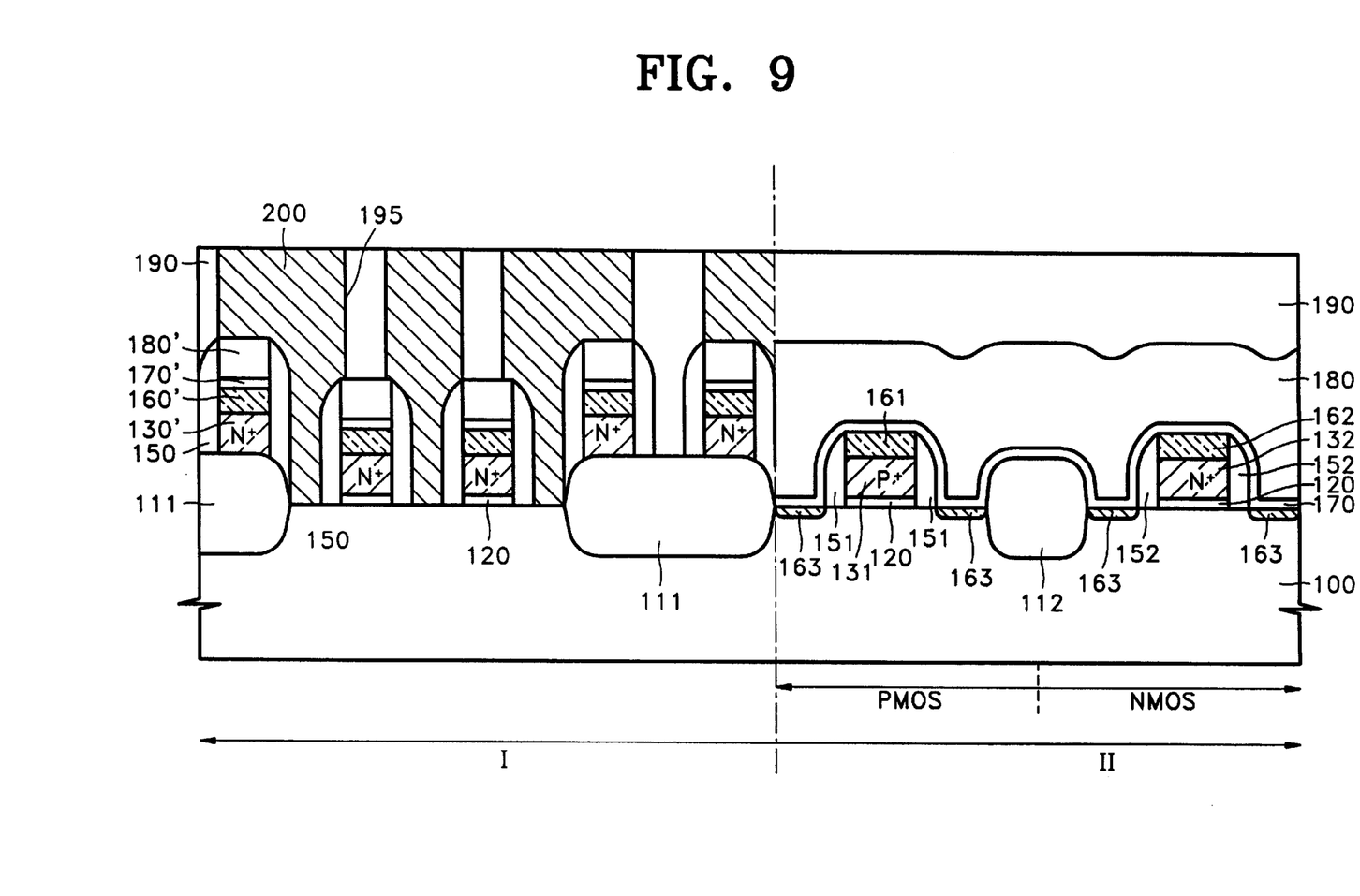

Next, referring to FIG. 9, the exposed portions of the interdielectric layer 190 are removed using the photoresist layer pattern 145 of FIG. 8 as an etching mask, and self-aligned contact holes 195 are formed. Here, an etching process for forming the self-aligned contact holes 195 is performed using an etchant having sufficient etching selectivity. That is, the etching process is performed such that the etching selectivity of the interdielectric layer 190 to the nitride layer patterns 180' and the gate spacers 150 of the gate conductive layer stacks is sufficient to completely expose parts of the semiconductor substrate 100 of the first region (I). When the etching process is over, the photoresist layer pattern 145 is removed, and self-aligned contact pads 200 are formed by filling the self-aligned contact holes 195 with a polysilicon layer. The self-aligned contact pads 200 are used as burying contact pads or direct contact pads of the DRAM device. That is, the self-aligned contact pads 200 are connected to a lower electrode of a capacitor as the burying contact pads, or the self-aligned contact pads 200 are connected to a bit line as the direct contact pads.

According to a method for manufacturing an MDL semiconductor device of the present invention, a self-aligned contact hole is formed in a DRAM device region, and a dual gate structure doped with impurity particles of different conductive types can be formed on respective gates of a complementary MOS transistor of a logic device region. It is beneficial to be able to manufacture an MDL semiconductor device including a logic device having an enhanced electrical performance and a DRAM device having high integration.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A method for manufacturing an MDL semiconductor device including a DRAM device and a logic device on a semiconductor substrate having a DRAM device region and a logic device region comprising:

forming a gate insulating layer and a gate conductive layer on a semiconductor substrate;

forming first and second gate conductive layer patterns in first and second MOS regions, respectively, in a logic device region of the semiconductor substrate;

forming first and second gate spacers on sidewalls of the first and second gate conductive layer patterns;

injecting impurity ions of a first conductivity type onto the exposed first gate conductive layer pattern and the semiconductor substrate using a first mask layer pattern which exposes the first MOS region;

injecting impurity ions of a second conductivity type onto the exposed gate conductive layer of the DRAM device region, the second gate conductive layer pattern of the logic device region, and the semiconductor substrate using a second mask layer pattern which exposes the DRAM device region and the second MOS region;

forming a nitride layer which covers the gate conductive layer of the DRAM device, and covers the first and second gate conductive layers of the logic device region, the first and second gate spacers, and the exposed semiconductor substrate;

forming gate conductive stacks, in which the gate conductive layer pattern of the DRAM device region and the nitride layer pattern are sequentially deposited using a third mask layer pattern which exposes parts of the nitride layer in the DRAM device region;

forming gate spacers on the sidewalls of the gate conductive layer stacks of the DRAM device region; and forming self-aligned contact pads inter-insulated between the gate spacers of the DRAM device region.

2. The method of claim 1 further comprising forming an isolation layer, which isolates the DRAM device region from the logic device region and isolates the first MOS region from the second MOS region.

3. The method of claim 1, wherein the impurity ions of the first conductivity type are P-type impurity ions.

4. The method of claim 1, wherein the impurity ions of the second conductivity type are N-type impurity ions.

5. The method of claim 1 further comprising forming a metal silicide layer/region on an upper portion of the gate conductive layer of the DRAM device region, an upper portion of the first and second gate conductive layer patterns of the logic device region, and the surface of the semiconductor substrate source/drain regions of the logic device.

6. The method of claim 1, further comprising, before forming the nitride layer, forming an oxide layer.

7. The method of claim 6, wherein the oxide layer is a high-temperature oxide layer.

8. The method of claim 1, wherein forming the gate conductive layer stacks further includes:

forming a fourth mask layer pattern which exposes parts of the nitride layer of the DRAM device region; and etching the nitride layer and the gate conductive layer using the fourth mask layer pattern as an etching mask.

9. The method of claim 1, wherein forming the self-aligned contact pads further includes:

forming an interdielectric layer which covers the gate conductive layer stacks and the gate spacers of the DRAM device region, and covers the nitride layer of the logic device region;

forming a fifth mask layer pattern which exposes regions of the interdielectric layer of the DRAM device region;

etching the exposed interdielectric layer regions using the fifth mask layer as an etching mask, and forming self-aligned contact holes which partially expose portions of the surface of the semiconductor substrate of the DRAM device region;

removing the fifth mask layer pattern; and forming self-aligned contact pads by filling the self-aligned contact holes with a conductive layer.

10. The method of claim 9, wherein the interdielectric layer is formed of a material having an etching selectivity with respect to the nitride layer.

11. The method of claim 10, wherein the interdielectric layer is an oxide layer.

12. The method of claim 10, wherein the conductive layer is a polysilicon layer.

* * * * *